(12) United States Patent
Grivna

(10) Patent No.: US 9,418,894 B2
(45) Date of Patent: Aug. 16, 2016

(54) ELECTRONIC DIE SINGULATION METHOD

(71) Applicant: Semiconductor Components Industries, LLC, Phoenix, AZ (US)

(72) Inventor: Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 6 days.

(21) Appl. No.: 14/222,464

(22) Filed: Mar. 21, 2014

(65) Prior Publication Data

US 2015/0270173 A1 Sep. 24, 2015

(51) Int. Cl.
*H01L 21/78* (2006.01)
*H01L 21/67* (2006.01)
*H01L 21/683* (2006.01)

(52) U.S. Cl.
CPC .......... *H01L 21/78* (2013.01); *H01L 21/67132* (2013.01); *H01L 21/6836* (2013.01); *H01L 2221/68336* (2013.01)

(58) Field of Classification Search
CPC ..... H01L 21/4814; H01L 21/64; H01L 21/70; H01L 21/702; H01L 21/782; H01L 21/784
See application file for complete search history.

(56) References Cited

U.S. PATENT DOCUMENTS

| 4,820,377 A | 4/1989 | Davis et al. |
| 5,075,253 A | 12/1991 | Sliwa, Jr. |
| 5,166,097 A | 11/1992 | Tanielian |
| 5,510,655 A | 4/1996 | Tanielian |
| 5,753,418 A | 5/1998 | Tsai et al. |
| 5,856,705 A | 1/1999 | Ting |
| 5,863,813 A | 1/1999 | Dando |
| 6,030,885 A | 2/2000 | Bothra |
| 6,140,151 A | 10/2000 | Akram |
| 6,165,814 A | 12/2000 | Wark et al. |
| 6,200,851 B1 | 3/2001 | Arnold |
| 6,214,703 B1 | 4/2001 | Chen et al. |
| 6,342,724 B1 | 1/2002 | Wark et al. |
| 6,406,979 B2 | 6/2002 | Fischer et al. |
| 6,563,204 B1 | 5/2003 | Glenn |
| 6,642,127 B2 | 11/2003 | Kumar et al. |
| 6,686,225 B2 | 2/2004 | Wachtler |
| 6,897,128 B2 | 5/2005 | Arita |
| 6,969,669 B2 | 11/2005 | Arita |
| 7,060,531 B2 | 6/2006 | Arita |
| 7,098,077 B2 | 8/2006 | Huang et al. |
| 7,129,114 B2 | 10/2006 | Akram |
| 7,253,477 B2 | 8/2007 | Loechelt et al. |
| 7,309,623 B2 | 12/2007 | Tan et al. |
| 7,335,576 B2 | 2/2008 | David et al. |

(Continued)

FOREIGN PATENT DOCUMENTS

| WO | WO 01/56063 A2 | 8/2001 |
| WO | WO 01/56063 A3 | 8/2001 |

(Continued)

*Primary Examiner* — Cheung Lee
(74) *Attorney, Agent, or Firm* — Kevin B. Jackson

(57) ABSTRACT

In one embodiment, die are singulated from a wafer having a back layer by placing the wafer onto a carrier substrate with the back layer adjacent the carrier substrate, forming singulation lines through the wafer to expose the back layer within the singulation lines, and applying a pressure substantially uniformly along the second major surface to batch separate the layer of material in the singulation lines. In one embodiment, a fluid filled vessel can be used to apply the pressure.

20 Claims, 7 Drawing Sheets

(56) References Cited

U.S. PATENT DOCUMENTS

| | | |
|---|---|---|
| 7,488,688 B2 | 2/2009 | Chung et al. |
| 7,629,228 B2 | 12/2009 | Haji et al. |
| 7,651,925 B2 | 1/2010 | Wyant |
| 7,678,670 B2 | 3/2010 | Arita et al. |
| 7,705,420 B2 | 4/2010 | Joodaki |
| 7,767,551 B2 | 8/2010 | Arita et al. |
| 7,781,310 B2 | 8/2010 | Grivna |
| 7,846,848 B2 | 12/2010 | Lewington et al. |
| 7,883,343 B1 | 2/2011 | Mulligan et al. |
| 7,906,410 B2 | 3/2011 | Arita et al. |
| 7,985,661 B2 | 7/2011 | Grivna |
| 7,989,319 B2 | 8/2011 | Grivna et al. |
| 8,012,857 B2 | 9/2011 | Grivna et al. |
| 8,178,372 B2 | 5/2012 | Lutgen et al. |
| 8,384,231 B2 | 2/2013 | Grivna et al. |
| 8,906,745 B1 | 12/2014 | Lindsey, Jr. et al. |
| 2003/0207579 A1 | 11/2003 | Rattner et al. |
| 2004/0087062 A1 | 5/2004 | Ohuchi |
| 2004/0102025 A1 | 5/2004 | Arita |
| 2004/0185580 A1 | 9/2004 | Goh |
| 2005/0084996 A1 | 4/2005 | Harper |
| 2005/0104165 A1 | 5/2005 | Ishio et al. |
| 2005/0142863 A1 | 6/2005 | Spandre |
| 2005/0196940 A1 | 9/2005 | Yajima et al. |
| 2006/0001130 A1 | 1/2006 | Islam et al. |
| 2006/0030078 A1 | 2/2006 | Jiang et al. |
| 2006/0118515 A1 | 6/2006 | Dolechek et al. |
| 2006/0154401 A1 | 7/2006 | Gardner et al. |
| 2006/0244096 A1 | 11/2006 | Sekiya |
| 2006/0278956 A1 | 12/2006 | Cadouri |
| 2007/0087524 A1 | 4/2007 | Montgomery |
| 2007/0111476 A1* | 5/2007 | Sugiura et al. ............. 438/460 |
| 2007/0132034 A1 | 6/2007 | Curello et al. |
| 2007/0148807 A1 | 6/2007 | Akram |
| 2007/0249178 A1 | 10/2007 | Ogihara |
| 2008/0099900 A1 | 5/2008 | Oganesian et al. |
| 2009/0001609 A1 | 1/2009 | Lim |
| 2009/0057838 A1 | 3/2009 | Arita et al. |
| 2009/0061595 A1 | 3/2009 | Weber et al. |
| 2009/0065904 A1 | 3/2009 | Wang |
| 2009/0263927 A1 | 10/2009 | Lin et al. |
| 2010/0048001 A1 | 2/2010 | Harikai et al. |
| 2010/0055875 A1 | 3/2010 | Haji et al. |
| 2010/0120227 A1* | 5/2010 | Grivna et al. ............. 438/462 |
| 2010/0173474 A1 | 7/2010 | Arita et al. |
| 2011/0175209 A1 | 7/2011 | Seddon et al. |
| 2011/0175225 A1 | 7/2011 | Seddon et al. |
| 2011/0177675 A1 | 7/2011 | Grivna et al. |
| 2011/0244657 A1 | 10/2011 | Grivna et al. |
| 2012/0244681 A1 | 9/2012 | Grivna et al. |

FOREIGN PATENT DOCUMENTS

| | | |
|---|---|---|
| WO | 2004066382 A1 | 8/2004 |
| WO | 2007007883 A1 | 1/2007 |
| WO | PCT/JP2007/006960 | 8/2007 |
| WO | 2008081968 A1 | 7/2008 |
| WO | 2009063620A1 A1 | 5/2009 |

* cited by examiner

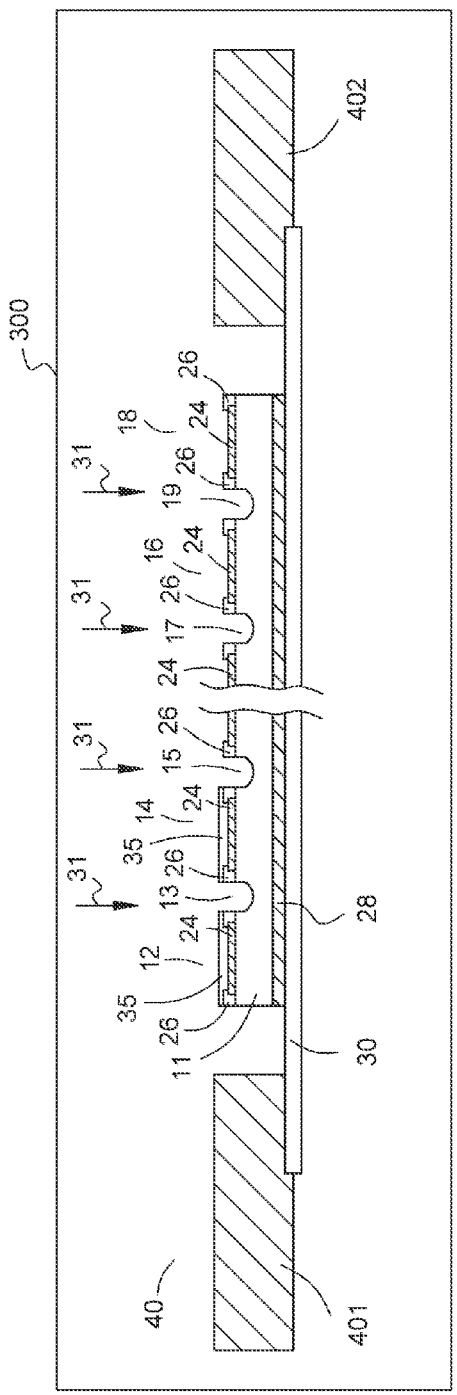
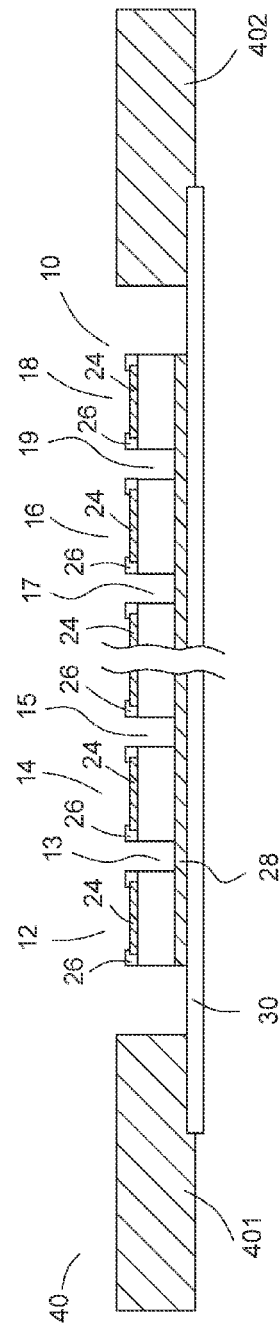
FIG. 4
FIG. 5

ELECTRONIC DIE SINGULATION METHOD

CROSS-REFERENCE TO RELATED APPLICATION

Not applicable.

BACKGROUND

The present invention relates, in general, to electronics and, more particularly, to methods for forming electronic devices such as semiconductor dies.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel along scribe grids or singulation lines that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe each singulation line on the semiconductor wafer could take over one hour or more. This time reduced the throughput and manufacturing capacity of a production facility.

Other methods, which have included thermal laser separation (TLS), laser ablation dicing, and plasma dicing, have been explored as alternatives to scribing. Plasma dicing is a promising process compared to scribing and other alternative processes because it supports narrower scribe lines, has increased throughput, and can singulate die in varied and flexible patterns. However, plasma dicing has had manufacturing implementation challenges. Such challenges have included non-compatibility with wafer backside layers, such as back metal layers, because the etch process has been unable to effectively remove or separate the backside layers from the singulation lines. Removing or separating the backside layers from the scribe lines is necessary to facilitate subsequent processing, such as pick-and-place and assembly processes.

Accordingly, it is desirable to have a method of singulating die from a semiconductor wafer that removes or separates the backside layers from within the singulation lines. It would be beneficial for the method to be cost effective and to minimize any damage to or contamination of the separated die.

BRIEF DESCRIPTION OF THE DRAWINGS

FIGS. 4-5 illustrate partial cross-sectional views of the wafer of FIG. 1 at various stages in a process of singulating die from the wafer in accordance with an embodiment of the present invention;

For simplicity and clarity of the illustration, elements in the figures are not necessarily drawn to scale, and the same reference numbers in different figures denote the same elements. Additionally, descriptions and details of well-known steps and elements are omitted for simplicity of the description. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Furthermore, the term "major surface" when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. Also, it is to be understood that where it is stated herein that one layer or region is formed on or disposed on a second layer or another region, the first layer may be formed or disposed directly on the second layer or there may be intervening layers between the first layer and the second layer. In addition, as used herein, the term formed on is used with the same meaning as located on or disposed on and is not meant to be limiting regarding any particular fabrication process.

DETAILED DESCRIPTION OF THE DRAWINGS

Figure 1:
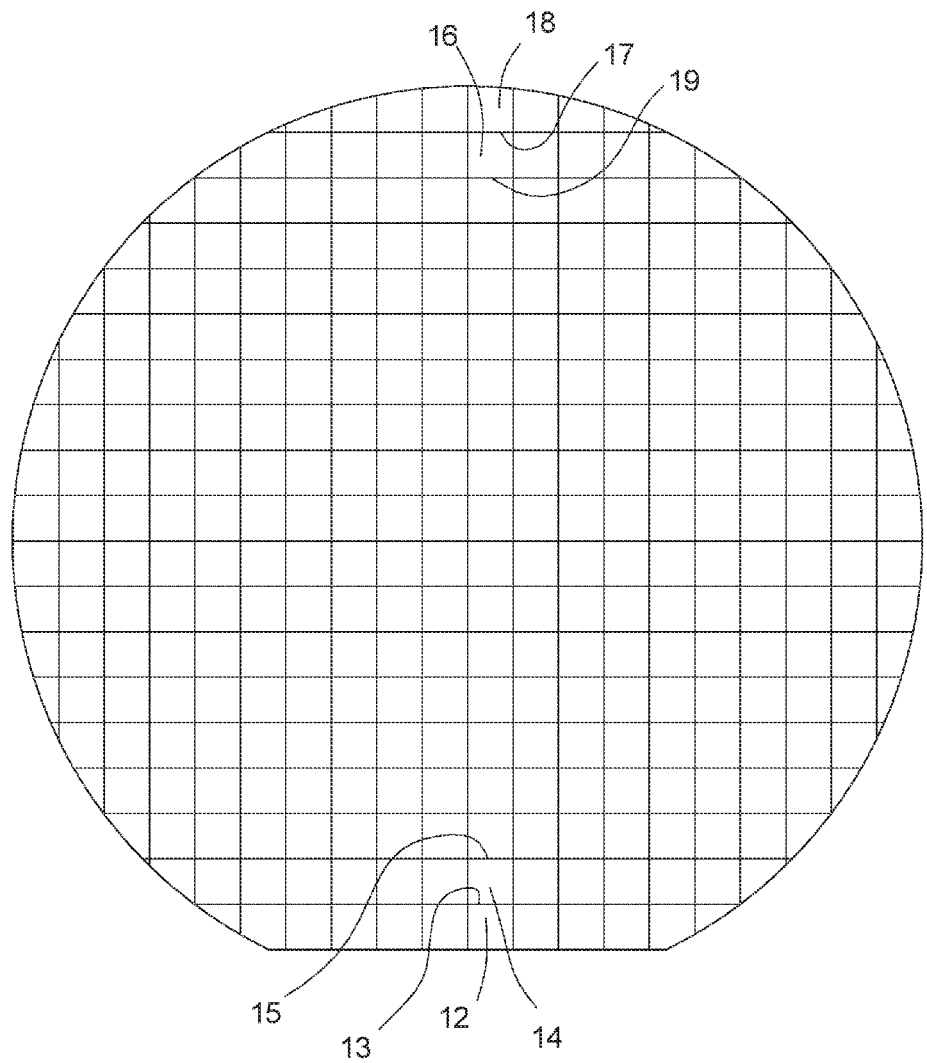
FIG. 1 illustrates a reduced plan view of an embodiment of a wafer in accordance with the present invention.

FIG. 1 is a reduced plan view that graphically illustrates a wafer 10 at a later step in fabrication. In one embodiment, wafer 10 can be a semiconductor substrate. Wafer 10 includes a plurality of semiconductor die, such as die 12, 14, 16, and 18, that are formed on or as part of semiconductor wafer 10. Die 12, 14, 16, and 18 are spaced apart from each other on wafer 10 by spaces in which singulation lines are to be formed or defined, such as scribe lines or singulation lines 13, 15, 17, and 19. As is well known in the art, all of the semiconductor die on wafer 10 generally are separated from each other on all sides by areas or spaces where scribe lines or singulation lines, such as singulation lines 13, 15, 17, and 19 are to be formed. Die 12, 14, 16, and 18 can be any kind of electronic device including semiconductor devices such as, diodes, transistors, discrete devices, integrated circuits, sensor devices, optical devices, or other devices known to one of ordinary skill in the art. In one embodiment, wafer 10 has completed wafer processing including the formation of a backside layer described later.

Figure 2:
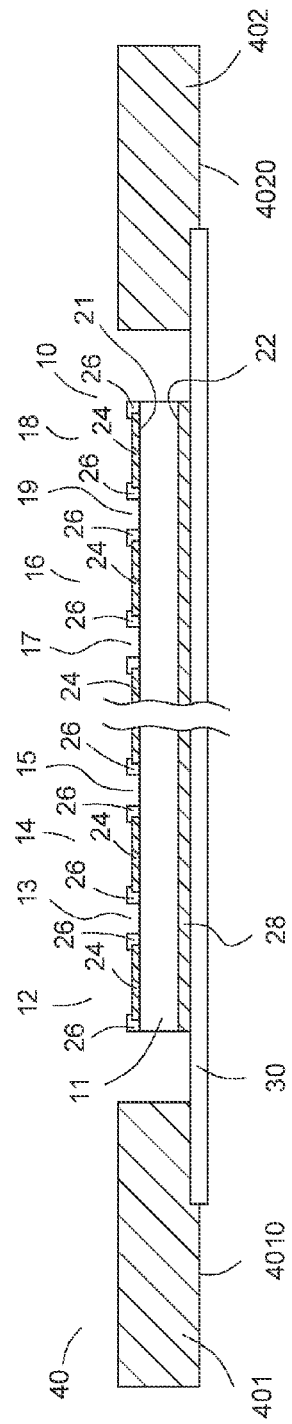
FIG. 2 illustrates a cross-sectional view of the wafer of FIG. 1 mounted to a carrier substrate in accordance with an embodiment of the present invention.

FIG. 2 illustrates an enlarged cross-sectional view of wafer 10 at an early step in a die singulation method in accordance with an embodiment. In one embodiment, wafer 10 is attached to a carrier substrate, transfer tape, or carrier tape 30 that facilitates supporting the plurality of die on wafer 10 after the die are singulated. Such carrier tapes are well known to those of skill in the art. In one embodiment, carrier tape 30 can be attached to a frame 40, which can include frame portions or portions 401 and 402. In one embodiment, frame 40 is made of a rigid material, such as stainless steel. As illustrated, carrier tape 30 can be attached to surface 4010 of frame portion 401 and to surface 4020 of frame portion 402 using, for example, the adhesive side of carrier tape 30.

In the cross-section illustrated, wafer 10 can include a bulk substrate 11, such as a silicon substrate, which can include opposing major surfaces 21 and 22. In other embodiments, bulk substrate 11 can comprise other semiconductor materials such as heterojunction semiconductor materials or substrate 11 can be an insulating material such as ceramic materials. In one embodiment, contact pads 24 can be formed along, in, on, or above portions of major surface 21 to provide for electrical contact between structures formed within substrate 11 and next levels of assembly or external elements. For example, contact pads 24 can be formed to receive bonding wires or clips that subsequently may be attached to contact pads 24, or contact pads 24 can be formed to receive a solder ball, bump or other type of attachment structure. Contact pads 24 generally can be a metal or other conductive material. Typically, a dielectric material 26 such as, a blanket deposited dielectric layer can be formed on or overlying major surface 21 to function as a passivation layer for wafer 10. In one embodiment, dielectric material 26 can be a material that etches at a slower rate than that of substrate 11. In one embodiment, dielectric material 26 can be a silicon oxide, silicon nitride, or polyimide when substrate 11 is silicon. It should also be noted that a separate polymer protective layer, such as a patterned protective layer, can be used to protect the areas not intended to be etched during subsequent processing. In one embodiment, the patterned protective layer can be a patterned photoresist layer. An example of such a protective layer is noted as element 35 in FIG. 4 described later.

In one embodiment, openings can be formed in dielectric material 26 (and other dielectric layers that can be formed above or below dielectric material 26) to expose underlying surfaces of contact pads 24 and surfaces of substrate 11 where singulation lines 13, 15, 17, and 19 are to be formed. In one embodiment, the patterned photoresist layer describes previously can be used to form the openings with an etch process. As illustrated in FIG. 2 and in accordance with the present embodiment, wafer 10 further includes a layer of material 28 formed on or overlying major surface 22 of wafer 10. In one embodiment, layer 28 can be a conductive back metal layer. Layer 28 can be any suitable conductive material appropriate for electronic technology. In one embodiment, layer 28 can be a multi-layer metal system such as, titanium/nickel/silver, titanium/nickel/silver/tungsten, chrome/nickel/gold, copper, copper alloys, gold, or other materials known to those skilled in the art. In some embodiments, layer 28 is greater than about one micron in thickness. In other embodiments, layer 28 is greater than about two microns in thickness. In still other embodiments, layer 28 is greater than about three microns in thickness. In another embodiment, layer 28 can be a wafer backside coating (WBC) film, such as a die-attach coating or film. In one embodiment, layer 28 can be formed having or provided with recesses, gaps, spaces, or channels between at least some adjacent die. In a further embodiment, the gaps are substantially aligned with corresponding spaces on the opposite side of wafer 10 where singulation lines 13, 15, 17, 19 will be formed. In another embodiment, layer 28 is separated from the edges of least some of the die.

Figure 3:
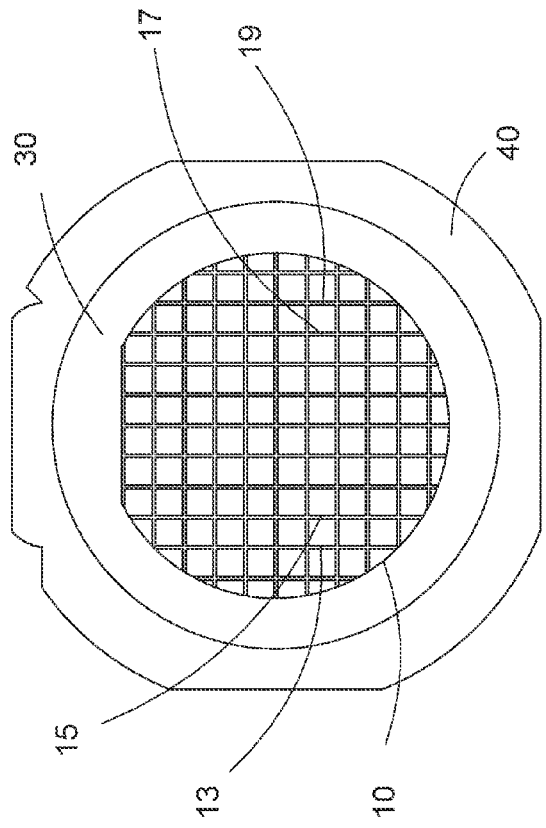
FIG. 3 illustrates a top view of the embodiment of FIG. 2.

FIG. 3 illustrates a top view of wafer 10 in accordance with the cross-sectional view of FIG. 2 after wafer 10 is be mounted on carrier tape 30 with layer 28 against carrier tape 30. In one embodiment, carrier tape 30 is mounted to frame 40. As illustrated in FIG. 3, frame 40 can be configured with alignment portions or notches to better assist placing frame 40 into processing equipment such as the equipment described herein.

FIG. 4 illustrates an enlarged cross-sectional view of wafer 10 at a subsequent step during a singulation process in accordance with the present embodiment. In FIG. 4, a plasma or dry etch singulation process is illustrated. It is understood that other singulation processes can be used. In one embodiment, wafer 10 mounted on carrier tape or film 30 is then placed within an etch apparatus 300, such as a plasma etch apparatus. In one embodiment, substrate 11 can be etched through the openings to form or define singulation lines or openings 13, 15, 17, and 19 extending from major surface 21. The etching process can be performed using a chemistry (generally represented as arrows 31) that selectively etches silicon at a much higher rate than that of dielectrics and/or metals. In one embodiment, wafer 10 can be etched using a process commonly referred to as the Bosch process. In one embodiment, wafer 10 can be etched using the Bosch process in a deep reactive ion etch system. In one embodiment, the width of singulation lines 13, 15, 17, and 19 can be from about five microns to about twenty microns. Such a width is sufficient to ensure that the openings that form singulation lines 13, 15, 17, and 19 can be formed completely through substrate 11 stopping proximate to or on layer 28 because of the etch selectivity as generally illustrated in FIG. 5. In one embodiment, layer 28 can be used as a stop layer for the plasma etch singulation process. In one embodiment, singulation lines 13, 15, 17, and 19 can be formed in about five to about thirty minutes using the Bosch process. A suitable etch apparatus is available from Plasma-Therm of St. Petersburg, Fla., U.S.A.

Figure 6:
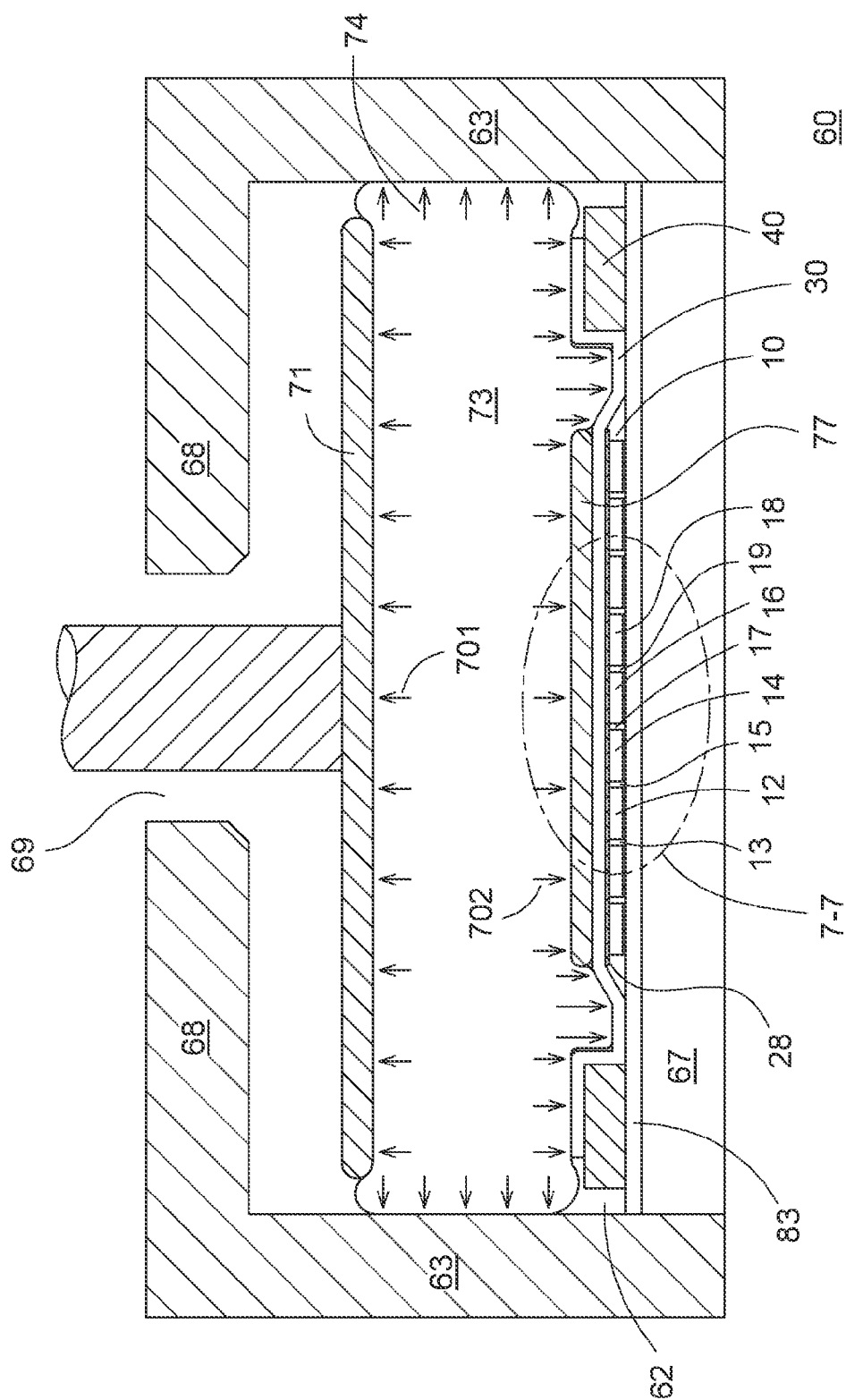
FIG. 6 illustrates a cross-sectional view of the wafer of FIG. 1 at a subsequent stage of singulation in accordance with an embodiment of the present invention.

FIG. 6 illustrates a cross-sectional view of a back layer separation apparatus 60 configured to hold wafer 10 including frame 40 and carrier tape 30. In one embodiment, separation apparatus 60 can be configured to process a single wafer and to provide a back layer separation process where layer 28 on wafer 10 is separated substantially at the same time (that is, batch separated) compared to other processes that separate only a localized portion of layer 28 at a time. In other embodiments, separation apparatus 60 can be configured to process multiple wafers each in a batch configuration.

Apparatus 60 can include a compression chamber 62 sized to accommodate wafer 10 and frame 40 depending upon the sizes of such structures. In one embodiment, compression chamber 62 is bounded on all sides by a plurality of generally vertical sidewalls 63 that extend generally upward from a lower chamber wall or surface 67. Sidewalls 63 can be attached to lower chamber wall 67 using any suitable attachment devices capable of maintaining pressure with compression chamber 62. Compression chamber 62 further includes an upper chamber wall or surface 68, which can include an opening 69 to accommodate a compression or pressure plate 71 or to provide an entrance for a non-compressible fluid. Compression chamber 62 and can be any suitable shape appropriate for processing wafer 10 and frame 40 or other holding structures.

Compression plate 71 is movably associated or attached within compression chamber 62 and adapted to apply a controlled and substantially uniform pressure to wafer 10 through a pressure transfer vessel 73 containing a fluid 74. In one embodiment, vessel 73 can be a fluid filled bladder that is oriented between wafer 10 and compression plate 71. In one embodiment, vessel 73 comprises a cross-linked polymer material that exhibits high elastic deformation, such as a rubber or other materials as known to those of ordinary skill in the art. In one embodiment, vessel 73 is a static pressure balloon. In one embodiment, fluid 74 can be water. In one embodiment, fluid 74 can be water that is anaerobic (that is, water having low dissolved oxygen content or that has been deoxygenated). In some embodiments, fluid 74 can be heated above room temperature. In some embodiments, fluid 74 can be heated to a temperature in range from about 35 degrees Celsius to about 65 degrees Celsius. In one embodiment, fluid 74 can be heated to a temperature in range from about 45 degrees Celsius to about 55 degrees Celsius. In other embodiments, fluid 74 can be a fluid having a higher viscosity than water. In some embodiments, fluid 74 can be liquid-crystalline material. In still other embodiments, vessel 73 can be filled with a solid material, such as synthetic microspheres, carbon nanotubes, graphene, or other solid or solid-like materials that can impart or transfer pressure from compression plate 71 to carrier tape 30 without damaging wafer 10. In some embodiments, vessel 73 can be filled with a gas. In accordance with the present embodiment and illustrated in FIG. 6, vessel 73 has a horizontal width proximate to wafer 10 that is larger than the horizontal width or diameter of wafer 10 to facilitate batch or near simultaneous singulation or separation of layer 28 in scribe lines 13, 15, 17, and 19 of wafer 10. That is, vessel 73 is configured or adapted to apply a pressure substantially uniformly along or across all of layer 28 and wafer 10 to provide batch separation of layer 28 in the scribe lines.

In an optional embodiment, a pressure plate 77 can be detachably placed in between vessel 73 and carrier tape 30 above or in spaced relationship with wafer 10 and layer 28. In one embodiment, pressure plate 77 can be a low-alloy, medium-carbon steel or high-carbon steel material with high yield strength, such as spring steel. Such a material allows pressure plate 77 to return to its original shape despite any significant bending. In one embodiment, pressure plate 77 can be a generally flat plate where the major surfaces lie in substantially parallel horizontal planes. In other embodiments, pressure plate 77 can have a lower surface (that is, the surface adjoining carrier tape 30) configured to first apply pressure to the outer portions of wafer 10 before or slightly before pressure applied to the more central portion of wafer 10. For example, in one embodiment pressure plate 77 can have a slightly concave major surface adjoining carrier tape 30 without pressure applied with vessel 73. In another embodiment, pressure plate 77 can have a slightly raised ridge, for example, in the shape or form of a ring around an outer periphery of pressure plate 77.

In some embodiments, a protective film or protective pad 83 is placed between wafer 10 and lower chamber wall 67 to protect and/or cushion wafer 10 during the separation of back layer 28. In one embodiment, protective film 83 is a non-adhesive film or a low adhesive film where the adhesive strength is selected so as to minimize the occurrence of individual die being removed from carrier tape 30 after separation of back layer 28 has occurred. In other embodiments, protective film 83 can have a high adhesive strength (that is, higher than the adhesive strength of carrier tape 30) if it is desired to have the separated die adhere to protective film 83, for example, for additional processing to the back side of wafer 10.

In some embodiments, a controlled downward pressure (represented by arrows 701 and 702) is applied through compression plate 71 using, for example, a stepper motor driving a threaded shaft attached to compression plate 71. In other embodiments, compression plate 71 can be adjusted using hydraulic or pneumatic techniques. In some embodiments, compression plate 71 can be adjusted manually. It is understood that apparatus 60 may include other sealing devices, fluid heating and delivery devices, and measurement and control systems that are not illustrated for the ease of understanding embodiments of the present invention. Suitable apparatus that can be configured in accordance with the description provided herein are available from Instron® of Norwood, Mass., U.S.A. and Geocomp Corporation of St. Johns, N.Y., U.S.A.

Figure 7:
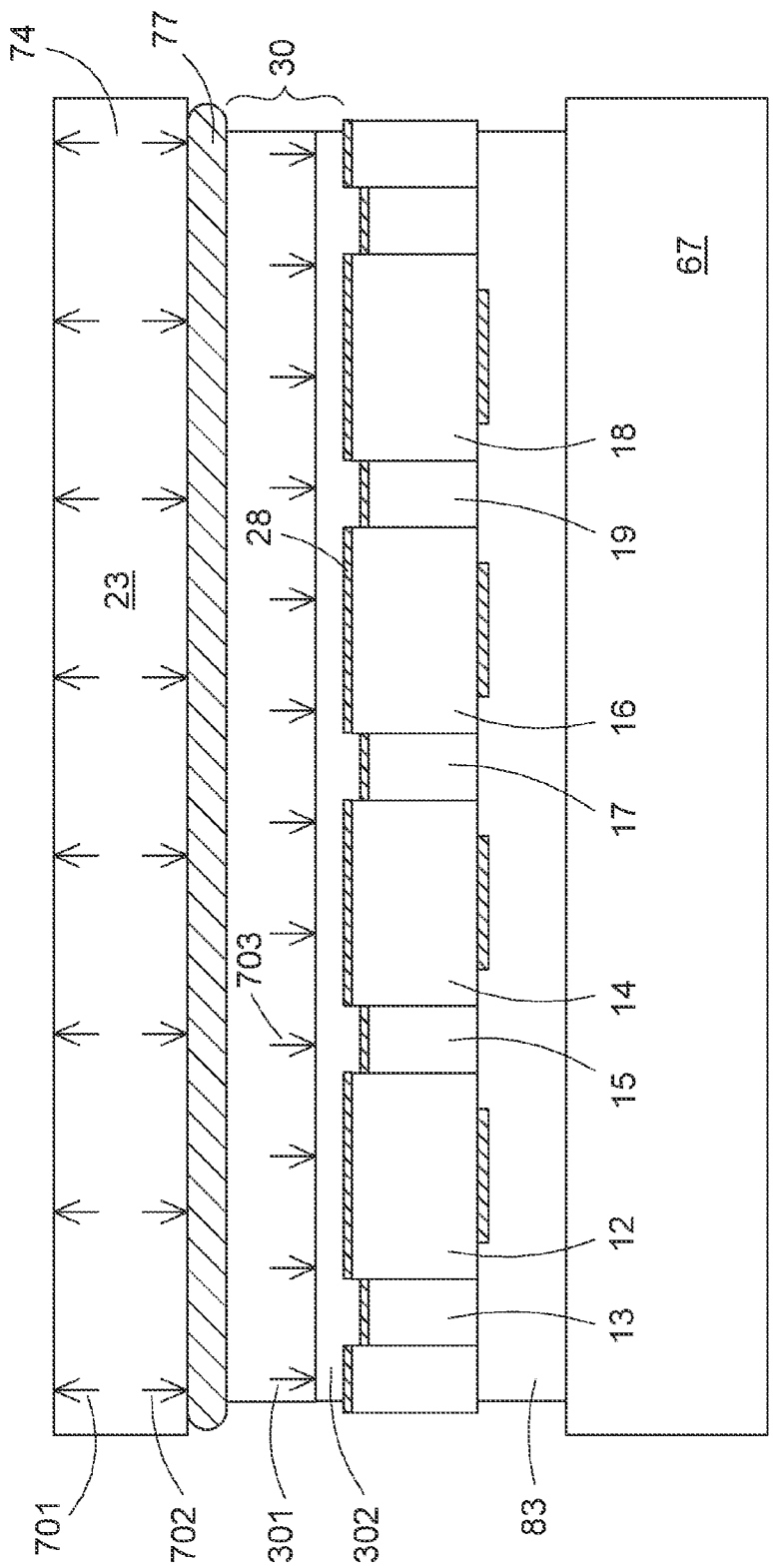
FIG. 7 illustrates an enlarged partial cross-sectional view of the embodiment of FIG. 6 in accordance with reference portion 7-7.

FIG. 7 illustrates an enlarged partial cross-sectional view of a portion of apparatus 60 and wafer 10 of FIG. 6 along reference portion 7-7. In FIG. 7, carrier tape 30 is enlarged to show both a singulation film portion 301 and an adhesive film portion 302 between singulation film portion 301 and layer 28 on wafer 10. In some embodiments, singulation film portion 301 can have a thickness from about 70 microns to about 90 microns and adhesive film portion 302 can have thickness from about 20 microns to about 40 microns. In accordance with some embodiments, pressure applied from compression plate 71 is transferred and applied through vessel 73 to optional pressure transfer plate 77 to carrier tape 30 as generally represented by arrows 701, 702, and 703. The downward force applied to carrier tape 30 extrudes adhesive film portion 30 in scribe lines 13, 15, 17, and 19 between die 12, 14, 16, and 18 to separate away or singulate portions of layer 28 in the scribe lines as generally illustrated in FIG. 7. In some embodiments, a downward force can be in the range from about 700 KPa to 1400 KPa. In other embodiments, downward force can be in the range from about 1400 KPa to 3500 KPa. One advantage of the present method is that it provides a batch singulation of layer 28 compared to previous processes that provide localized singulation of layer 28. The present embodiments thus reduce manufacturing cycle time. Another advantage is that metal separates cleanly and self-aligned to the die edge and further, remaining material of layer 28 between die will remain on the tape after the die are removed with no need to flip the tape to expose and remove or separate the metal.

Figure 8:
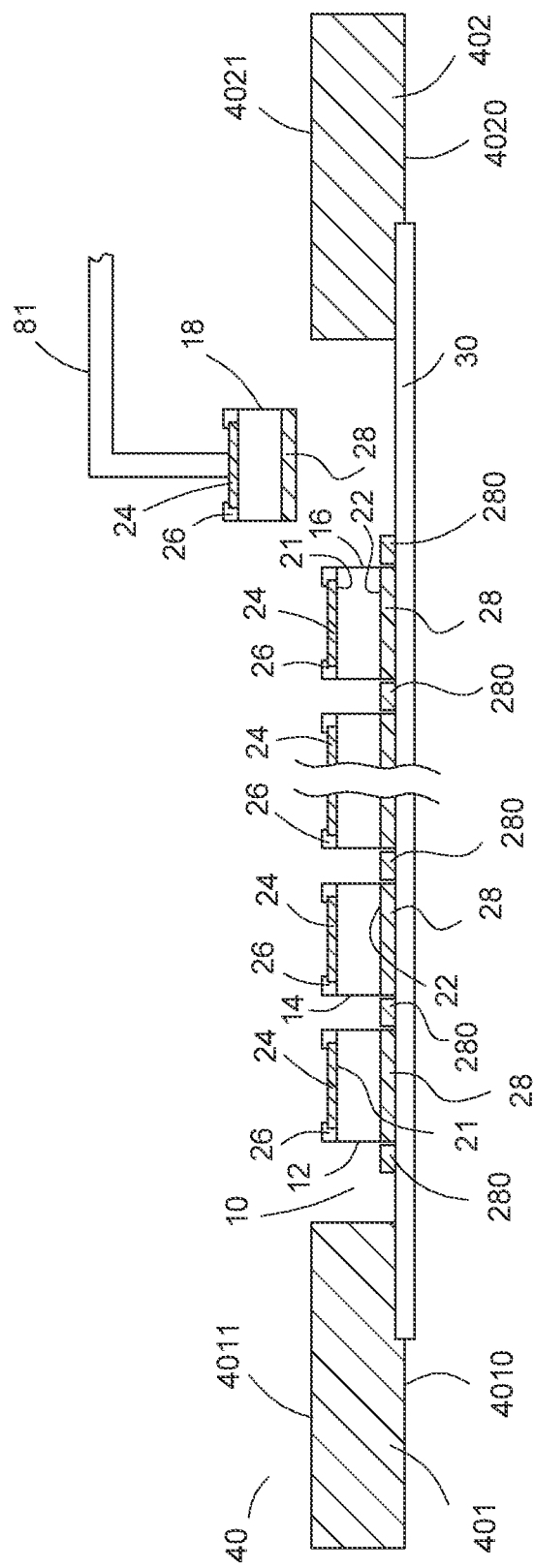
FIG. 8 illustrates the wafer of FIG. 1 after singulation and at a further stage of manufacture in accordance with an embodiment of the present invention.

FIG. 8 illustrates a cross-sectional view of wafer 10 at a further stage of manufacturing. In one embodiment, die 12, 14, 16, and 18 can be removed from carrier tape 30 as part of a further assembly process using, for example, a pick-and-place apparatus 81 as generally illustrated in FIG. 8. As illustrated in FIG. 8 portions 280 separated from layer 28 remain on carrier tape 30. In one embodiment, die 12, 14, 16, and 18 can be attached to conductive lead frames or substrates, electrically connected to leads for traces, and encapsulated with a plastic molding compound. In one embodiment, carrier tape 30 can be exposed to a UV light source prior to the pick-and-place step to reduce the adhesiveness of carrier tape 30.

Figure 9:
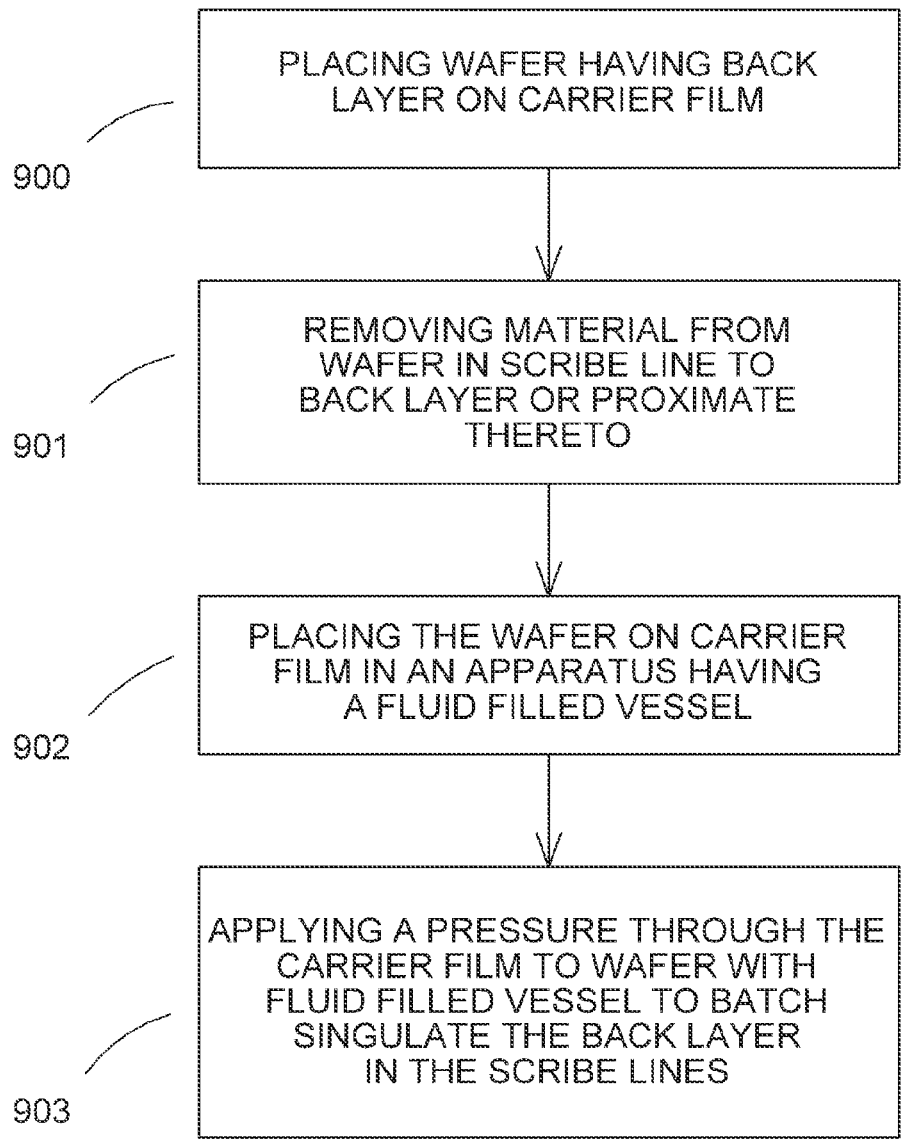
FIG. 9 illustrates a flow chart of a batch singulation method in accordance with an embodiment of the present invention.

FIG. 9 illustrates a flow chart for batch singulating back-side material in accordance with an embodiment. In step 900, wafer 10 can be placed onto a carrier film, such as carrier tape 30, as generally illustrated in FIG. 2. In accordance with the present embodiment, wafer 10 includes back layer, such as layer of material 28. In some embodiments, layer 28 is a conductive metal material. In other embodiments, layer 28 can be a Wafer Back Coat (WBC) film, such as a die-attached coating or film. In step 901, material, such as semiconductor material, is removed from scribe lines 13, 15, 17, and 19. Semiconductor material can be removed to expose layer 28 in scribe lines 13, 15, 17, and 19, or small amount of material can be left in scribe lines 13, 15, 17, and 19. Stated another way, a sufficient amount of material is removed so that layer 28 can be effectively separated in scribe lines 13, 15, 17, and 19 in a subsequent step. In step 902, wafer 10 on carrier tape 30 is placed in apparatus 60 as described with FIG. 6. In one embodiment, wafer 10 is placed front side or device side down with layer 28 and carrier tape 30 facing upward. In one embodiment, pressure plate 77 can be placed adjacent to carrier tape 30 proximate to wafer 10 and layer 28. A fluid filled vessel, such as vessel 73, can then placed proximate to pressure plate 77 as generally illustrated in FIGS. 6 and 7. In one embodiment, the fluid filled vessel is filled with deoxygenated water heated to temperature from about 35 degrees Celsius to about 65 degrees Celsius. In step 903, a pressure is applied to the fluid filled vessel using, for example, a moveable compression plate 71 as described in conjunction with FIG. 6. In one embodiment, a pressure range from about 500 KPa to 5000 KPa can be used. In one embodiment, the pressure applied to the fluid filled vessel causes portions of the carrier film, for example, adhesive film portion 302, to extrude into the scribe lines, such as scribe lines 13, 15, 17, 19, which batch singulates or simultaneously separates all or major portions of layer 28 from the scribe lines. In other embodiments, step 903 can applied multiple times (that is, more than once on the same wafer) with pressure applied, then removed, then re-applied. In some embodiments, the re-applied pressure can be greater than the previously applied pressure. In other embodiments, the re-applied pressure can be less than the previously applied pressure. In still other embodiments, compression plate 71 can be slightly tilted and rotated to apply additional pressure around the edge regions of wafer 10. In further embodiments, compression plate 71 can be rocked back and forth in multiple directions.

From all of the foregoing, one skilled in the art can determine that, according to one embodiment, a method of singulating a wafer (for example, element 10) comprises providing a wafer (for example, element 10) having a plurality of die (for example, elements 12, 14, 16, 18) formed on the wafer and separated from each other by spaces, wherein the wafer has first and second opposing major surfaces (for example, elements 21, 22), and wherein a layer of material (for example, element 28) is formed along the second major surface. The method comprises placing the wafer onto a carrier substrate (for example, element 30). The method comprises singulating the wafer through the spaces to form singulation lines (for example, elements 13, 15, 17, 19), wherein singulating comprises stopping in proximity to the layer of material. The method comprises applying a pressure substantially uniformly along the second major surface to separate the layer of material in the singulation lines.

In one embodiment of the foregoing method, after applying the pressure portions (for example, element 280) of the separated layer of material remain on the carrier substrate. In another embodiment, applying the pressure can include applying the pressure through the carrier substrate with a fluid filled vessel (for example, element 73) and the fluid filled vessel has a width that exceeds that of the wafer. In a further embodiment, the fluid filled vessel can contain water. In a still further embodiment, the water can be deoxygenated. In another embodiment, the method can further include placing a pressure plate between the fluid filled vessel and the carrier substrate, and wherein providing the wafer can comprise providing a semiconductor wafer where the layer of material comprises a conductive material, placing the wafer onto the carrier substrate can comprise placing onto a carrier tape attached to a frame, applying the pressure can comprise applying in a compression chamber, and applying the pressure can comprise a pressure from about 500 KPa to about 5000 KPa. In a further embodiment, the method can further comprise heating the wafer while applying the pressure. In a still further embodiment, the wafer can be heated to a temperature from about 35 degrees Celsius to about 65 degrees Celsius. In another embodiment, the method can further comprise placing a protective film proximate to the first major surface of the wafer before applying the pressure.

From all of the foregoing, one skilled in the art can determine that, according to another embodiment, a method for batch singulating a semiconductor wafer comprises providing the semiconductor wafer (for example, element 10) having a plurality of die (for example, elements 12, 14, 16, 18) formed on the semiconductor wafer and separated from each other by spaces, wherein the semiconductor wafer has first and second opposing major surfaces (for example, elements 21, 22), and wherein a layer of material (for example, element 28) is formed along the second major surface. The method comprises placing the wafer onto a carrier substrate (for example, element 30), wherein the layer of material is adjacent the carrier substrate. The method comprises etching the semiconductor wafer through the spaces to form singulation lines (for example, elements 13, 15, 17, 19) and to expose portions of the layer of material in the singulation lines. The method comprises applying a pressure substantially uniformly along the second major surface of the semiconductor wafer through the carrier substrate to separate the layer of material in the singulation lines.

In one embodiment of the foregoing method, applying the pressure can include extruding portions of the carrier substrate into the singulation lines to separate the layer of material, and wherein the portions (for example, element 280) of the separated layer of material remain on the carrier substrate. In another embodiment, applying the pressure can include using a fluid filled vessel having a width greater than that of the semiconductor wafer. In a further embodiment, applying the pressure can include using a static pressure balloon. In a still further embodiment, the static pressure balloon can filled with a heated fluid comprising one or more of a liquid and a gas. In another embodiment, providing the semiconductor wafer can include providing the layer of material comprising a conductive material greater than about three microns in thickness, and wherein applying the pressure can comprise a pressure from about 500 KPa to about 5000 KPa.

From all of the foregoing, one skilled in the art can determine that, according to an additional embodiment, a method of singulating a wafer comprises providing a wafer (for example, element 10) having a plurality of die (for example, elements 12, 14, 16, 18) formed on the wafer and separated from each other by spaces, wherein the wafer has first and second opposing major surfaces (for example, element s21, 22), and wherein a layer of material (for example, element 38) is formed along the second major surface. The method comprises placing the wafer onto a carrier substrate (for example, element 30) having an adhesive portion, wherein the layer of material is adjacent the carrier substrate. The method separating the wafer through the spaces to form singulation lines (for example, elements 13, 15, 17, 19), wherein singulating lines terminate in proximity to the layer of material. The method comprises applying a pressure across the second surface of the wafer to extrude the adhesive portion into the singulation lines to separate the layer of material in the singulation lines, wherein portions (for example, element 280) of the separated layer of material remain on the carrier substrate.

In one embodiment of the foregoing method the applying step is repeated more than once. In another embodiment, applying the pressure can comprise compressing a static pressure balloon (for example, element 73) having a diameter greater than that of the wafer. In a further embodiment, applying the pressure can comprise using a fluid filled vessel (for example, elements 73, 74). In a still further embodiment, the method can futher comprise heating the wafer while applying the pressure. In another embodiment, can further comprise placing a pressure plate (for example, element 77) between the fluid filled vessel and the carrier substrate before applying the pressure. In a further embodiment, providing the wafer can comprise providing the layer of material having a thickness greater than about three microns and applying the pressure can comprise a pressure between about 500 KPa to about 5000 KPa.

From all of the foregoing, one skilled in the art can determine that, according to further embodiment, a method for separating a layer of material on a wafer comprises providing the wafer (for example, element 10) having a plurality of die (for example, element 12, 14, 16, 18) formed on the wafer and separated from each other by singulation lines (for example, elements 13, 15, 17, 19), wherein the wafer has first and second opposing major surfaces (for example, elements 21, 22), and wherein a layer of material (for example, element 28) is formed along the second major surface, and wherein the singulation lines extend from the first major surface and terminate proximate to the layer of material, and wherein the wafer is attached to a carrier substrate (for example, element 30). The method comprises simultaneously applying a pressure along the entire second major surface of the wafer through the carrier substrate to separate the layer of material in the singulation lines.

In view of all of the above, it is evident that a novel method is disclosed. Included, among other features, is placing a substrate having a layer of material on a major surface of the substrate onto a carrier tape, and forming singulation lines through the substrate to expose portions of the layer of material within the singulation lines. A pressure is substantially uniformly applied along the second major surface of the substrate through the carrier tape to separate the layer of material in the singulation lines in a batch configuration. In one embodiment, the pressure is applied with a fluid filled vessel that is controllably compressed against the wafer. The method provides, among other things, an efficient, reliable, and cost effective process for batch singulating substrates that include back layers, such as thicker back metal layers or WBC layers.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, other forms of removable support materials can be used instead of carrier tapes.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method of singulating a wafer comprising:
providing a wafer having a plurality of die formed on the wafer and separated from each other by spaces, wherein the wafer has first and second opposing major surfaces, and wherein a layer of material is formed along the second major surface;
placing the wafer onto a carrier substrate;
singulating the wafer through the spaces to form singulation lines, wherein singulating comprises stopping in proximity to the layer of material;
placing the wafer and carrier substrate within a chamber, the chamber at least partially enclosing a pressure transfer vessel, wherein the pressure transfer vessel contains a fluid; and
moving a compression structure against the pressure transfer vessel thereby applying a pressure substantially uniformly along the second major surface to separate the layer of material in the singulation lines.

2. The method of claim 1, wherein portions of the separated layer of material remain on the carrier substrate after applying the pressure.

3. The method of claim 1, wherein placing the wafer and carrier substrate within the chamber comprises placing the pressure transfer vessel against the carrier substrate such that the carrier substrate is between the pressure transfer vessel and the wafer, and wherein the pressure transfer vessel has a width that exceeds that of the wafer.

4. The method of claim 3, wherein the pressure transfer vessel contains water.

5. The method of claim 4, wherein the water is deoxygenated.

6. The method of claim 3 further comprising placing a pressure plate between the pressure transfer vessel and the carrier substrate; and wherein:
providing the wafer comprises providing a semiconductor wafer where the layer of material comprises a conductive material; and
placing the wafer onto the carrier substrate comprises placing onto a carrier tape attached to a frame, wherein the applied pressure is from about 500 KPa to about 5000 KPa.

7. The method of claim 1, further comprising heating the wafer while applying the pressure.

8. The method of claim 7, wherein the wafer is heated to a temperature from about 35 degrees Celsius to about 65 degrees Celsius.

9. The method of claim 1 further comprising placing a protective film proximate to the first major surface of the wafer before applying the pressure.

10. The method of claim 1, wherein applying the pressure comprises extruding portions of the carrier substrate into the singulation lines to separate the layer of material, and wherein the portions of the separated layer of material remain on the carrier substrate.

11. The method of claim 1, wherein:
placing the wafer comprises placing the wafer onto a carrier tape attached to a frame;
singulating comprises plasma etching the wafer; and
applying the pressure comprises simultaneously applying the pressure uniformly along the entire second major surface using the pressure transfer vessel.

12. The method of claim 1, wherein moving the compression structure comprises moving the compression structure against a static pressure balloon.

13. The method of claim 12, wherein static pressure balloon is filled with a heated fluid comprising one or more of a liquid and a gas.

14. The method of claim 1, wherein providing the wafer comprises providing the layer of material comprising a conductive material greater than about three microns in thickness, and wherein applying the pressure comprises applying a pressure from about 500 KPa to about 5000 KPa.

15. The method of claim 1, wherein the applying step is repeated more than once.

16. The method of claim 1, wherein moving the compression structure comprises moving the compression structure against a static pressure balloon having a diameter greater than that of the wafer.

17. The method of claim 1 further comprising placing a pressure plate between the pressure transfer vessel and the carrier substrate before applying the pressure, wherein:
 providing the wafer comprises providing the layer of material having a thickness greater than about three microns; and
 applying the pressure comprises a pressure between about 500 KPa to about 5000 KPa.

18. A method of singulating a wafer comprising:
 providing a wafer having a plurality of die formed on the wafer and separated from each other by spaces, wherein the wafer has first and second opposing major surfaces, and wherein a layer of material is formed along the second major surface;
 placing the wafer onto a carrier substrate;
 singulating the wafer through the spaces to form singulation lines, wherein singulating comprises stopping in proximity to the layer of material; and
 placing the wafer and carrier substrate into a chamber, the chamber at least partially enclosing a pressure transfer vessel containing a fluid, wherein the pressure transfer vessel comprises a material having a high elastic deformation; and
 moving a compression structure against the pressure transfer vessel to apply a pressure to the entire second major surface to separate the layer of material in the singulation lines.

19. The method of claim 18, wherein placing the wafer and carrier substrate comprises placing the carrier substrate between the wafer and the pressure transfer vessel, and wherein the method further comprises:
 placing a pressure plate between the pressure transfer vessel and the carrier substrate, wherein the pressure plate has a shape configured such that pressure is first applied to outer portions of the wafer.

20. A method of singulating a wafer comprising:
 providing a wafer having a plurality of die formed on the wafer and separated from each other by spaces, wherein the wafer has first and second opposing major surfaces, and wherein a layer of material is formed along the second major surface;
 placing the wafer onto a carrier substrate;
 singulating the wafer through the spaces to form singulation lines, wherein singulating comprises stopping in proximity to the layer of material; and
 placing the wafer and carrier substrate within a chamber, the chamber at least partially enclosing a pressure transfer vessel that contains a fluid and a compression structure movably associated with the chamber; and
 moving the compression structure against the pressure transfer vessel thereby applying a pressure to the second major surface to separate the layer of material in the singulation lines.

* * * * *